(12) United States Patent
Manjrekar et al.

(10) Patent No.: US 11,218,148 B2
(45) Date of Patent: Jan. 4, 2022

(54) DIODE CLAMPED SOLID-STATE CIRCUIT BREAKER WITHOUT DYNAMIC VOLTAGE BALANCING ISSUES

(71) Applicant: University of North Carolina Charlotte, Charlotte, NC (US)

(72) Inventors: Madhav Manjrekar, Cary, NC (US); Ehab H. Shoubaki, Davidson, NC (US); Tiancan Pang, Charlotte, NC (US)

(73) Assignee: University of North Carolina Charlotte, Charlotte, NC (US)

( * ) Notice: Subject to any disclaimer, the term of this patent is extended or adjusted under 35 U.S.C. 154(b) by 0 days.

(21) Appl. No.: 17/013,403

(22) Filed: Sep. 4, 2020

(65) Prior Publication Data

US 2021/0075419 A1    Mar. 11, 2021

Related U.S. Application Data

(60) Provisional application No. 62/896,022, filed on Sep. 5, 2019.

(51) Int. Cl.
*H03K 17/56* (2006.01)

(52) U.S. Cl.
CPC .................................. *H03K 17/56* (2013.01)

(58) Field of Classification Search
None
See application file for complete search history.

(56) References Cited

U.S. PATENT DOCUMENTS

| | | | |
|---|---|---|---|
| 5,170,310 A * | 12/1992 | Studtmann | H02H 1/04 361/65 |
| 2020/0106260 A1 * | 4/2020 | Telefus | H03K 17/687 |

* cited by examiner

*Primary Examiner* — Jeffery S Zweizig
(74) *Attorney, Agent, or Firm* — Thomas | Horstemeyer, LLP

(57) ABSTRACT

Various examples are provided related to diode clamped solid-state circuit breakers (SSCBs). Their configuration allows operation of the SSCB without dynamic voltage balancing issues. In one example, a diode clamped SSCB includes source-side switches and line-side switches connected between a DC source connection and a line-side connection. Clamping capacitors are connected at a common connection point between the source-side and line side switches and source-side and line-side clamping diodes are connected between the source-side switches and line-side switches and the clamping capacitors. Sequential switching of the source-side switches or line-side switches can avoid dynamic voltage balancing issues.

20 Claims, 9 Drawing Sheets

-- Prior Art --

-- Prior Art --

DIODE CLAMPED SOLID-STATE CIRCUIT BREAKER WITHOUT DYNAMIC VOLTAGE BALANCING ISSUES

CROSS REFERENCE TO RELATED APPLICATIONS

This application claims priority to, and the benefit of, U.S. provisional application entitled "Novel Diode-Clamped Solid-State Circuit Breaker Without Dynamic Voltage Balancing Issues" having Ser. No. 62/896,022, filed on Sep. 5, 2020, which is hereby incorporated by reference in its entirety.

BACKGROUND

Low-voltage solid-state circuit breakers (SSCBs) rated up to 1 kV have gradually matured and came to marketing, fueled by the introduction of wide band gapped (WBG) semiconductor devices. However, to break into a higher voltage range, stringing available to lower voltage devices in series is required. This causes issues with the balancing of the blocked voltage across the cascaded devices during on/off transient operation. The series-connected devices may fail to turn off simultaneously due to minute differences in device characteristics and responsiveness of the gate drivers, which can result in one of the devices bearing the brunt of the circuit voltage leading to an overvoltage device failure. Current practice suggests several auxiliary circuit designs to resolve this issue, but those typically increase complexity of SSCBs and decrease their reliability.

SUMMARY

Aspects of the present disclosure are related to diode clamped solid-state circuit breakers (SSCBs). A novel diode clamped SSCB is disclosed which can address voltage balancing issues encountered in state-of-the-art cascaded device topologies for SSCBs. Rather than turn off the switching devices simultaneously as what happens in traditional SSCB cascaded topologies, the disclosed topology turns off the semiconductor devices sequentially while clamping the turn off voltage across each switching device, providing a balanced turn off voltage distribution.

In one aspect, among others, a diode clamped solid-state circuit breaker (SSCB) comprises a series of N source-side switches connected in series between a first DC source connection and a common connection point, a series of N line-side switches connected in series between a line-side connection and the common connection point, and a series of N clamping capacitors connected in series between a second DC source connection and the common connection point. The series of N source-side switches can comprise a first source-side switch connected to the first DC source connection and a second source-side switch connected adjacent to the first source-side switch; the series of N line-side switches can comprise a first line-side switch connected to the line-side connection and a second line-side switch connected adjacent to the first line-side switch; and the series of N clamping capacitors can comprise a first clamping capacitor connected to the second DC source connection and a second clamping capacitor connected adjacent to the first clamping capacitor. A source-side surge protector can be connected across the first source-side switch and a line-side surge protector can be connected across the first line-side switch. A source-side clamping diode can be connected at a first end between the first and second source-side switches and at a second end between the first and second clamping capacitors and a line-side clamping diode can be connected at a first end between the first and second line-side switches and at a second end between the first and second clamping capacitors. N can be greater than two.

In one or more aspects, the SSCB can comprise control circuitry configured to control switching of the series of N source-side switches in response to a detected source-side fault and the series of N line-side switches in response to a detected line-side fault. The control circuitry can comprise gate drivers associated with the series of N source-side switches and the series of N line-side switches. The control circuitry can sequentially turn off the series of N source-side switches from an N-th source-side switch to the first source-side switch in response to the detected source-side fault. The control circuitry can turn off the second source-side switch before turning off the first source-side switch. The control circuitry can sequentially turn off the series of N line-side switches from an N-th line-side switch to the first line-side switch in response to the detected line-side fault. The control circuitry can turn off the second line-side switch before turning off the first line-side switch.

In various aspects, the SSCB can comprise a second source-side clamping diode connected at a first end between the second source-side switch and a third source-side switch connected adjacent to the second source-side switch, and at a second end between the second clamping capacitor and a third clamping capacitor of the series of N clamping capacitors, the third clamping capacitor connected adjacent to the second clamping capacitor; and a second line-side clamping diode connected at a first end between the second line-side switch and a third line-side switch connected adjacent to the second line-side switch, and at a second end between the second clamping capacitor and the third clamping capacitor. The first and second clamping capacitors can have equal capacitance or different capacitances. The capacitance of the first clamping capacitor can be greater than the capacitance of the second clamping capacitor.

In some aspects, the SSCB can comprise control circuitry configured to sequentially turn off the series of N source-side switches in response to the detected source-side fault, wherein the control circuitry turns off the third source-side switch before turning off the second source-side switch, and turns off the second source-side switch before turning off the first source-side switch. The SSCB can comprise control circuitry configured to sequentially turn off the series of N line-side switches in response to the detected line-side fault, wherein the control circuitry turns off the third line-side switch before turning off the second line-side switch, and turns off the second line-side switch before turning off the first line-side switch.

In another aspect, a method comprises supplying DC voltage through a diode clamped solid-state circuit breaker (SSCB) by turning on a series of N source-side switches and a series of N line-side switches of the SSCB, the series of N source-side switches connected in series between a first DC source connection and the common connection point and a series of N line-side switches connected in series between a line-side connection and the common connection point; detecting a source-side fault or a line-side fault; and sequentially turning off the series of N source-side switches from an N-th source-side switch to the first source-side switch in response to the detected source-side fault or sequentially turning off the series of N line-side switches from an N-th line-side switch to the first line-side switch in response to the detected line-side fault.

The series of N source-side switches can comprise a first source-side switch connected to the first DC source connection and a second source-side switch connected adjacent to the first source-side switch, and the series of N line-side switches comprising a first line-side switch connected to the line-side connection and a second line-side switch connected adjacent to the first line-side switch. The SSCB can further comprise a series of N clamping capacitors connected in series between a second DC source connection and the common connection point, N−1 source-side clamping diodes each connected between different pairs of adjacent source-side switches in the series of N source-side switches and different pairs of adjacent clamping capacitors in the series of N clamping capacitors, and N−1 line-side clamping diodes each connected between different pairs of adjacent line-side switches in the series of N line-side switches and the different pairs of adjacent clamping capacitors.

The second source-side switch can be turned off before the first source-side switch is turned off to direct current flow through a first clamping capacitor of the series of N clamping capacitors and one of the N−1 source-side clamping diodes and the first source-side switch is turned off to the direct current flow through a surge protector connected across the first source-side switch. The second line-side switch can be turned off before the first line-side switch is turned off to direct current flow through the first clamping capacitor and one of the N−1 line side clamping diodes and the first line-side switch is turned off to the direct current flow through a surge protector connected across the first line-side switch.

In one or more aspects, N can equal two and the series of N clamping capacitors can comprise the first clamping capacitor and a second clamping capacitor, wherein the first and second clamping capacitors have equal capacitance or a capacitance of the first clamping capacitor can be greater than a capacitance of the second clamping capacitor. Sequentially turning off the series of N source-side switches can comprise turning off a third source-side switch before the second source-side switch is turned off to direct current flow through the first clamping capacitor and a second clamping capacitor and another one of the N−1 source-side clamping diodes. Sequentially turning off the series of N line-side switches can comprise turning off a third line-side switch before the second line-side switch is turned off to direct current flow through the first clamping capacitor and a second clamping capacitor and another one of the N−1 line-side clamping diodes. Each clamping capacitor of the series of N clamping capacitors can have a different capacitance.

Other systems, methods, features, and advantages of the present disclosure will be or become apparent to one with skills in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1:
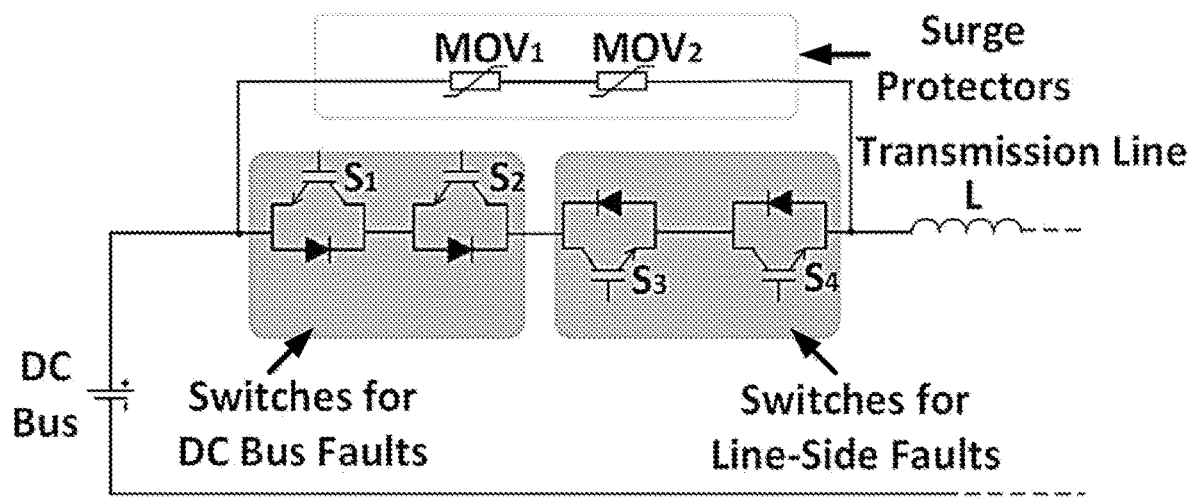
FIG. 1 is a schematic diagram illustrating an example of a conventional solid-state circuit breaker (SSCB) topology with series connected switches, in accordance with various embodiments of the present disclosure.

Disclosed herein are various examples related to diode clamped solid-state circuit breakers and their operation without dynamic voltage balancing issues. Reference will now be made in detail to the description of the embodiments as illustrated in the drawings, wherein like reference numbers indicate like parts throughout the several views.

A solid-state circuit breaker (SSCB), a semiconductor device-based fault current interruption technology, outperforms traditional electro-mechanical circuit breakers in many aspects. In comparison with a conventional mechanical circuit breaker, the SSCB can desist from fault current in a much faster speed without an electric arc. With proper fault detection devices, the fault current in the SSCB can be interrupted before the current increases too much, which makes it especially superior to mechanical circuit breakers in the protection of DC systems, such as shipboard and DC micro grid applications.

Figure 2:
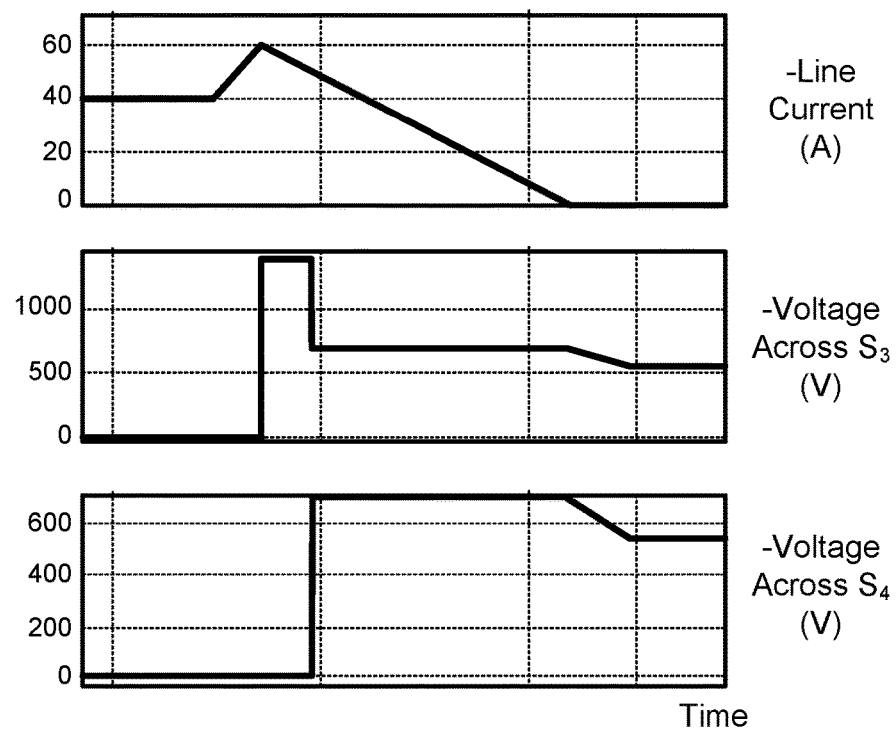
FIG. 2 illustrates an example of a dynamic voltage unbalancing issue caused by the asynchronous gate delay in the conventional SSCB topology of FIG. 1, in accordance with various embodiments of the present disclosure.

In recent years, low-voltage SSCBs have gradually become technically mature and started to come into market. FIG. 1 shows a simplified schematic diagram illustrating an example of a conventional medium voltage SSCB with series connected switches. However, with the increment of operating voltage demand, the series-connected switches can result in dynamic voltage-imbalance issues among the switches. The series-connected devices may fail to turn off simultaneously due to device parasitic capacitance mismatch and turn-off delay times originating from the gate drivers. As a result, dynamic overvoltage can arise across a single switch. FIG. 2 illustrates an example of a dynamic voltage unbalancing issue in a conventional SSCB with series-connected switches. Several auxiliary circuits dealing with the voltage dynamic unbalancing issue have been proposed, but these auxiliary circuits increase the complexity of SSCBs and decrease their reliability.

Figure 3:
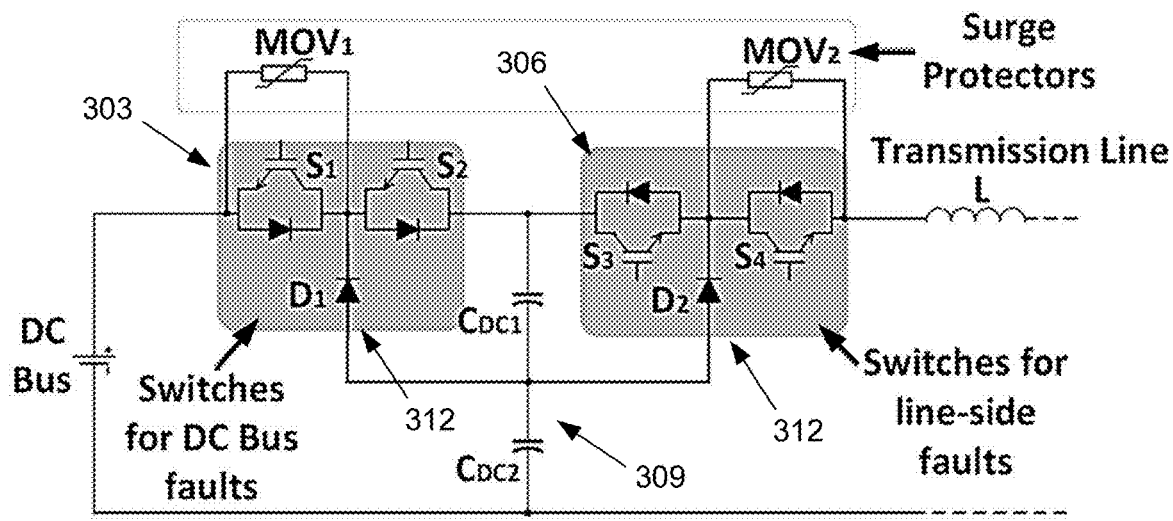
FIG. 3 is a schematic diagram illustrating an example of a diode clamped SSCB topology, in accordance with various embodiments of the present disclosure.

To address the above issues, a new type of SSCB topology named a diode clamped SSCB is presented in this disclosure. FIG. 3 illustrates an example of a diode clamped SSCB, which includes a series of source-side switches (e.g., $S_1$, $S_2$) 303 and a series of line-side switches (e.g., $S_3$, $S_4$) 306 connected to a transmission line (L). A series of clamping capacitors (e.g., $C_{DC1}$, $C_{DC2}$) 309 is connected from a ground or neutral line to a connection point between the series of source-side switches 303 and the series of line-side switches 306. Clamping diodes (e.g., $D_1$, $D_2$) 312 are connected between pairs of adjacent source-side switches 303 or line-side switches 306 and between a corresponding pair of clamping capacitors 309 as illustrated in FIG. 3.

In the diode clamped SSCB, switches are turned off successively rather than simultaneously to interrupt the line current. During the breaking process, the voltages across the switches are clamped by the clamping capacitors and MOVs in the breaker and therefore can be maintained lower than the blocking voltage of the switching devices. In the diode clamped SSCB, the design requirements for clamping voltage and energy absorption of the MOVs are lower than in the conventional SSCB, and hence series-connected MOVs with a large total clamp voltage can be saved. In addition, an asymmetric configuration of the diode clamped SSCB may also be used to limit the increment of fault current, shorten current breaking period and reduce the size of MOVs in the breaker. The operation principles, design consideration and experimental results of this novel topology under symmetric and asymmetric configurations are presented next.

Operating Principle

In the proposed diode clamped SSCB topology, the voltage across the switches is clamped by the capacitors and diodes. Therefore, the switches can be turned off successively rather than simultaneously during the faults. This topology allows the use of cheaper and less bulky MOVs rated at half the SSCB voltage rating. The modes of operation in the event of a line-side fault and simulation voltage and current waveforms will be discussed with respect to FIGS. 4A-4C, 5 and 6. Whenever a line-side fault is detected, a first switch will turn off and the fault current commutes through a clamping diode D1. During this mode, the voltage across the fault is a portion of (e.g., half) the DC bus voltage reducing energization of line inductance and hence growth of fault current. Additional switches can be turned off to further reduce the voltage across the fault. After a dead-time period, another switch is turned off switching the fault current to a surge protector (e.g., MOV) which absorbs the line energy reducing the fault current to zero. This switching sequence ensures that switching devices will share the DC bus voltage at the end of the turn off event, and each will not encounter a voltage higher than their individual blocking capacity in transient. Therefore, intricate auxiliary circuits for transient voltage balancing are not needed and regular gate drivers can be used.

Diode Clamped SSCB with Symmetric Configuration.

In the diode clamped SSCB with symmetric configuration, the clamping capacitors, $C_{DC1}$ and $C_{DC2}$, have the same capacitance ($C_{DC1}=C_{DC2}$) and share the DC bus voltage ($V_{DC}$) equally. After the switches are turned off, the voltages across the switches will be clamped to the voltage of the clamping capacitors, equaling half of the DC bus voltage. In principle, the operating voltage of the breaker will be twice the rated voltage of the employed semiconductor devices. This is one of the advantages of the diode clamped SSCB with symmetric configuration.

Figure 4A:
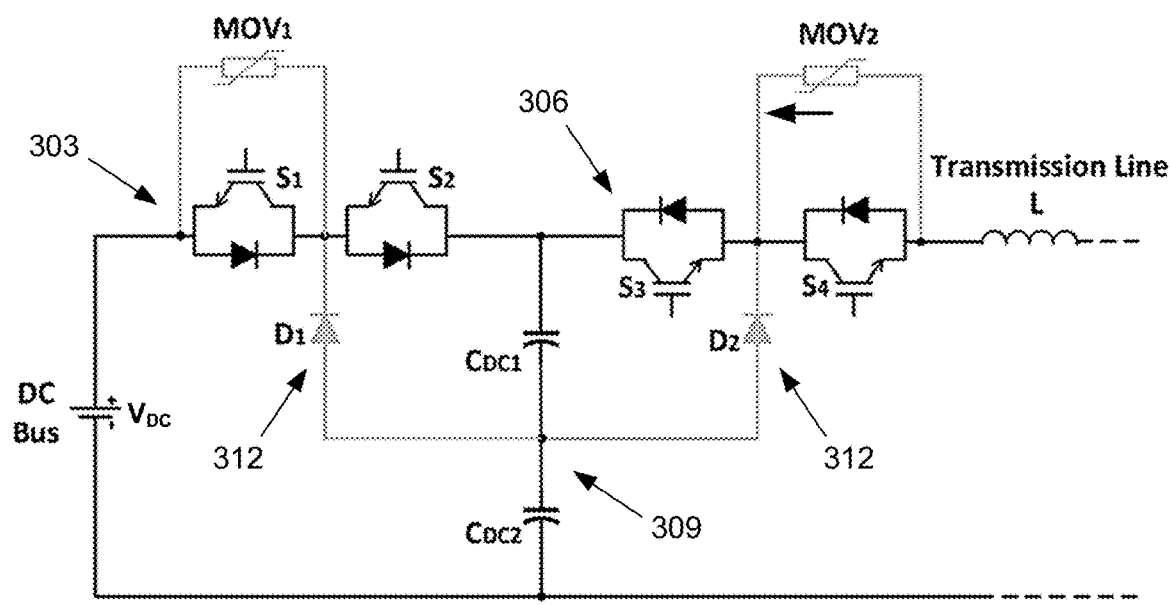
FIGS. 4A, 4B and 4C illustrate subinterval modes of operation of the diode clamped SSCB topology of FIG. 3 during a line-side fault, in accordance with various embodiments of the present disclosure.
Figure 4B:
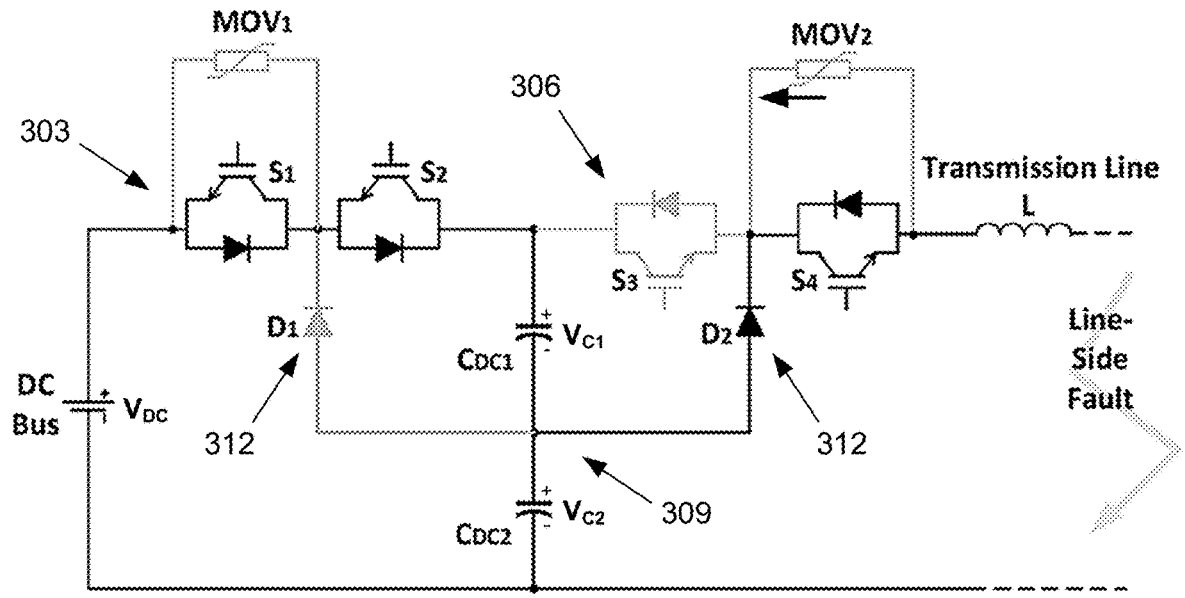
Figure 4C:
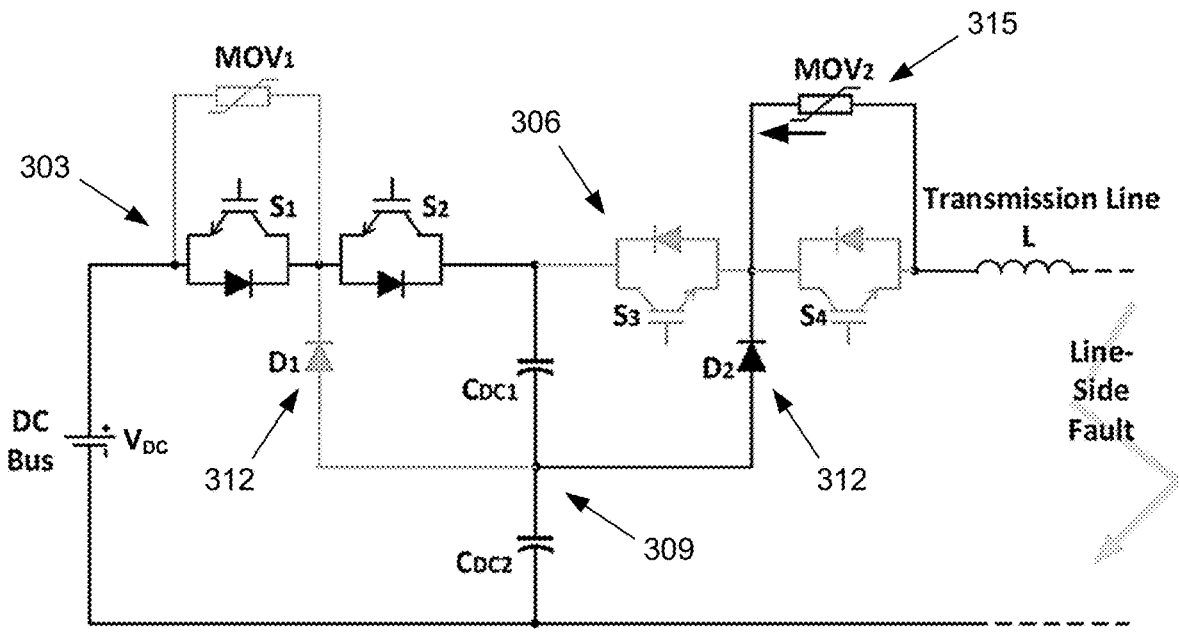
Figure 5:
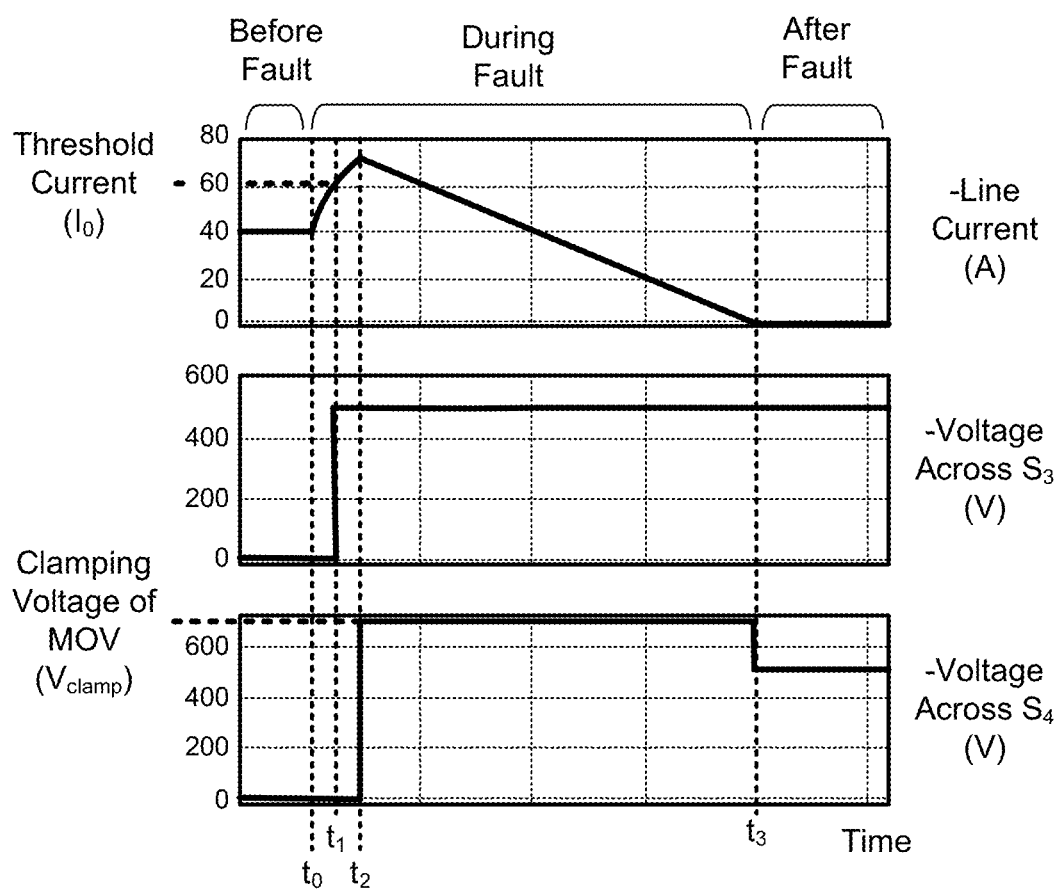
FIGS. 5, 6 and 7 illustrate examples of simulated line current and switch voltages in the diode clamped SSCB topology of FIG. 3 with symmetrical and asymmetrical configurations, in accordance with various embodiments of the present disclosure.

As shown in FIG. 3, the circuit of the diode clamped SSCB is horizontally symmetrical and thus the breaker can be used to interrupt bi-directional fault currents. In other words, the breaker can clear the faults occurring either on the DC bus or transmission line. However, the capability of the breaker to clear the DC bus fault is limited by the resonance between the line inductor and clamping capacitors. Hence, the bidirectional protection can only be achieved by the breaker in the applications with limited line inductances, such as shipboard applications. Since the operating process of the breaker in the two fault scenarios is similar, only the operation of the breaker for line-side faults is discussed here. The operation subintervals of the diode clamped SSCB of FIG. 3 while dealing with a line-side fault are shown in FIGS. 4A-4C. Simulation waveforms depicting the line current as well as the voltages across the line-side switches 306 are shown in FIG. 5 with the diode clamped SSCB in the symmetric configuration. The simulation waveforms of FIG. 5 are based upon a diode clamped SSCB in a symmetric configuration with $C_{DC1}=C_{DC2}=0.5$ mF, $V_{DC}=1000$V, and $I_{load}=40$ A.

During normal operation, all the switches 303 and 306 are turned on to enable the conduction path through the diode clamped SSCB as shown in FIG. 4A. Whenever the relay detects a line-side fault current, control circuitry will trip a first line-side switch $S_3$ to open and transfer the fault current to the conduction loop through the clamping capacitors 309 as shown in FIG. 4B. During this subinterval, the voltage across the fault is decreased to half of the DC bus voltage, so the increment of the fault current slows down as shown during the interval from $t_1$ to $t_2$ in FIG. 5.

After a short period of delay time, a second switch $S_4$ is turned off and the fault current commutes into $MOV_2$ 315 where the energy stored in the transmission line is absorbed as shown in FIG. 4C. After that, the fault current decreases gradually to zero as shown during the interval from $t_2$ to $t_3$ in FIG. 5. It can be seen from the waveforms of the voltages across switches $S_3$ and $S_4$, that the two switches are not turned off at the same time and there is no overvoltage imposed on either of the switches during the breaking process. This demonstrates that the proposed diode clamped SSCB does not suffer from dynamic voltage unbalancing issues.

Diode Clamped SSCB with Asymmetric Configuration.

An asymmetric configuration with the capacitance of one capacitor less than the other capacitor (e.g., $C_{DC1}<C_{DC2}$) can be applied to diode clamped SSCB to restrain the increment of fault current during the delay time and shorten the breaking time of the breaker. The charge Q held by the series connected capacitors, $C_{DC1}$ and $C_{DC2}$, can be given by:

$$Q=C_{DC1}V_{C1}=C_{DC2}V_{C2} \quad (1)$$

According to Equation (1), the voltage shared by each of the capacitors is inversely proportional to their capacitances. Hence, the voltage of $C_{DC2}$, $V_{C2}$, is lower than $V_{C1}$, in the asymmetric configuration. The operating process of the diode clamped SSCB in an asymmetric configuration is the same as that in the symmetric configuration as shown in FIGS. 4A-4C.

Figure 6:
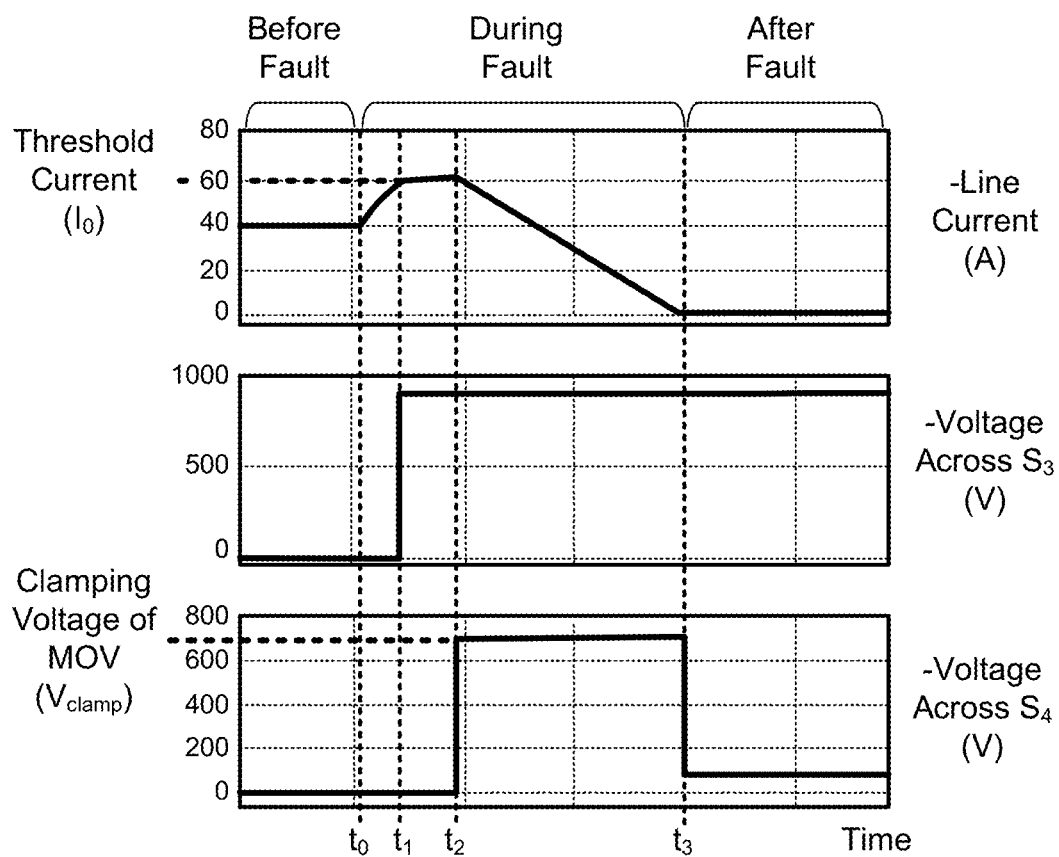

FIG. 6 shows the simulation waveforms of the line current and voltage across each of the line-side switches with the diode clamped SSCB in the asymmetric configuration. In this case, $C_{DC2}=0.5$ mF=$9\times C_{DC1}$, $V_{DC}=1000$V, and $I_{load}=40$ A. During the interruption process, as soon as the switch $S_3$ is open, the voltage across the faulted transmission line drops from $V_{DC}$ to $V_{C2}$ which is relatively small in the asymmetric configuration. In this way, the increment of fault current can be limited as shown in the waveform of line current during the interval from $t_1$ to $t_2$ in FIG. 6.

Figure 7:
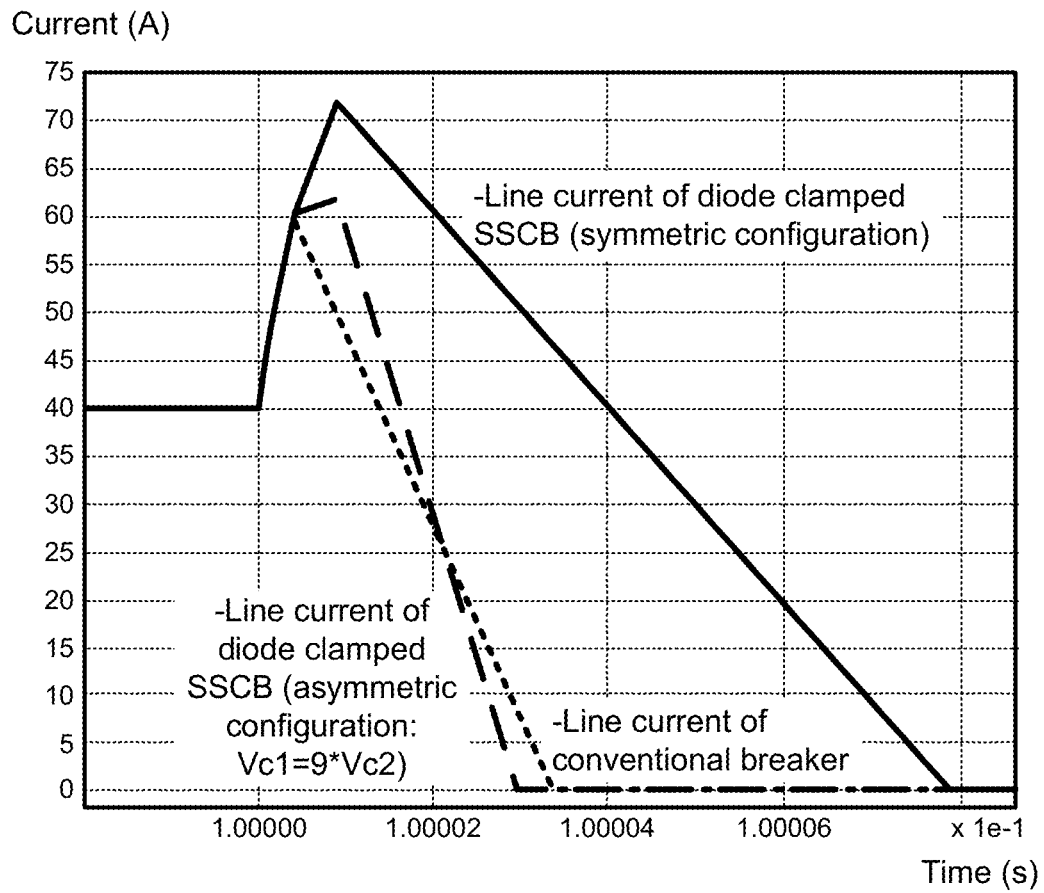

The asymmetric configuration can also shorten the breaking time of the converter. The breaking time here refers to the time spent by the breaker from receiving the trip signal to decreasing the line current to leakage current level. In FIG. 6, the breaking time is the time interval between $t_1$ and $t_3$. In order to attain accurate analysis results for the performance of the breaker, the response time of relay is neglected. Thus, the breaking time can be mainly separated into two time periods, namely the delay time between the operation of $S_3$ and $S_4$ called $t_{delay}$, and the time for the MOV to absorb the energy called $t_{mov}$. The value of $t_{delay}$ depends on the performance of the switching devices as well as the gate drivers and it is usually the constant value ($t_2-t_1$) depicted in FIGS. 5 and 6. The value of the breaking time ($t_{brk}$) can be expressed as:

$$t_{brk} = t_{delay} + t_{mov} = t_{delay} + \frac{LI_0 + V_{c2}t_{delay}}{V_{clamp} - V_{c2}}, \quad (2)$$

where $V_{clamp}$ represents the clamping voltage of MOVs and L represents the equivalent inductance of the transmission line. From Equation (2), the breaking time of the breaker is proportional to the value of $V_{C2}$. Therefore, in the diode clamped SSCB, the breaking time can be reduced by applying an asymmetric configuration to reduce the voltage value across capacitor $C_{DC2}$. However, in contrast to this benefit, the diode clamped SSCB partially loses its capability to enhance its operating voltage resulting from higher peak inverse voltage (PIV) imposed on switch $S_3$ as shown in FIG. 6. The main motivation of using an asymmetric configuration in the diode clamped SSCB is to shorten its breaking time. The breaking speed of the diode clamped SSCB in asymmetric configuration can be faster than the conventional breaker for the same applied system and fault situation as shown in FIG. 7, which is a comparison of the simulation waveforms of the line currents in the conventional and diode clamped SSCBs.

Design Considerations

In order to warrant the normal operation of the diode clamped SSCB, several technical considerations were considered during the design of the breaker in either symmetric or asymmetric configuration. First, the capacitances of the clamping capacitors, $C_{DC1}$ and $C_{DC2}$, should to be selected carefully to avert overvoltage being imposed on switching devices after the current interruption. Second, the energy to be absorbed during the breaking process should be quantified to make sure the energy volume of the selected MOV is large enough for the situation. Finally, special consideration should be taken in the selection of the semiconductor devices in the breaker design to make the selected devices satisfy the operating voltage, operating current and conduction efficiency of the applied system.

Capacitor Selection.

In FIGS. 4B and 4C, after switch $S_3$ opens, line current is transferred to the conduction loops discharging capacitor $C_{DC2}$ and charging $C_{DC1}$. At the same time, the voltage across $C_{DC2}$, $V_{C2}$, decreases gradually and the voltage $V_{C1}$ increases until the line current is extinguished by the breaker. As the voltage across $S_3$ is clamped by capacitor $C_{DC1}$ after the breaking process, the value of $V_{C1}$ should be limited below the rated voltage of $S_3$ to avert impairing the switching device. In other words, the increment of $V_{C1}$ during the breaking process should be suppressed, which can be achieved by the proper selection of the capacitors.

If the breaker detects the fault and starts to operate at the time instant when t=0, the increment of $V_{C1}$ in the breaking process can be expressed as:

$$\Delta V_{c1} = \qquad (3)$$
$$-\Delta V_{c2} = \frac{1}{c}\int_0^{t_{brk}} i_{c2}dt = \frac{1}{c}\int_0^{t_{brk}} i_L dt = \frac{1}{c_{DC2}}\int_0^{t_{brk}}\left(I_0 + \frac{V_{C2}(t)}{L}t\right)dt +$$
$$\frac{1}{c_{DC2}}\int_{t_{delay}}^{t_{brk}}\left[I_0 + \frac{V_{C2}(t)}{L}t_{delay} + \frac{V_{C2}(t) - V_{clamp}}{L}(t - t_{delay})\right]dt,$$

where the effect of the switching transience is neglected, $i_L$ represents line current and $I_0$ represents threshold current of the breaker. From Equation (3), the range of capacitances of $C_{DC2}$ that make the voltage across $S_3$ lower than its rated voltage can be determined and expressed as:

$$C_{DC2} > \frac{\int_0^{t_{brk}}\left(I_0 + \frac{V_{C2}(t)}{L}t\right)dt}{V_{S3^*} - V_{c1}(0)} + \qquad (4)$$
$$\frac{\int_{t_{delay}}^{t_{brk}}\left[I_0 + \frac{V_{C2}(t)}{L}t_{delay} + \frac{V_{C2}(t) - V_{clamp}}{L}(t - t_{delay})\right]dt}{V_{S3^*} - V_{c1}(0)},$$

where rated voltage of Switch $S_3$ is denoted as $V_{S3}^*$.

Since the value of $V_{C2}$ monotonically decreases during the interruption period and the value of the right side of Equation (4) is proportional to $V_{C2}$, $V_{C2}(t)$ can be replaced by $V_{C2}(0)$ to simplify the algebraic analysis without impairing the plausibility of the expression. After $t_{brk}$ in Equation (2) is introduced into Equation (4), the range of $C_{DC2}$ can be determined from several easy-access parameters of the breaker and its applied system as shown in:

$$C_{DC2} > \frac{I_0 t_{delay} + \frac{1}{2L}V_{C2}(0)t_{delay}^2}{V_{S3^*} - V_{c1}(0)} + \frac{1}{2L}\frac{(LI_0 + V_{C2}(0)t_{delay})^2}{V_{S3^*} - V_{c1}(0)}, \qquad (5)$$

By using Equation (5), the capacitance of $C_{DC2}$ can be determined and that of $C_{DC1}$ can be attained according to the relationship between $C_{DC1}$ and $C_{DC2}$ in different configurations. In symmetric configuration, $C_{DC1}=C_{DC2}$; and in asymmetric configuration, $C_{DC1}<C_{DC2}$.

MOV Selection.

Same as for the conventional SSCB, the diode clamped SSCB uses a MOV to absorb energy during its breaking operation. Since the voltage across the faulted transmission line is reduced by half in the diode clamped SSCB with symmetric configuration in comparison with conventional SSCB during the operation of MOV, the clamp voltage of MOV along with the switches block voltage can be lower than that needed in its counterpart of conventional SSCB. This advantage is even more dominant in a diode clamped SSCB with the asymmetric configuration.

On the other hand, the energy absorbing capacity also should be considered during the selection of MOV. The energy absorbed in diode clamped SSCB during the whole breaking time can be calculated by:

$$W_R = \int_0^{t_{mov}} V_{clamp}\left(I_0 + \frac{V_{c2}(0)}{L}t_{delay} - \frac{V_{clamp} - V_{c2}(0)}{L}t\right)dt, \quad (6)$$

Where t=0 when switch $S_4$ opens and MOV starts to absorb energy. After $t_{mov}$ in Equation (2) is introduced into Equation (6), the energy absorbed $W_R$ can be expressed as:

$$W_R = \frac{1}{2}L\frac{V_{clamp}}{V_{clamp} - V_{c2}(0)}\left(I_0 + \frac{V_{c2}(0)}{L}t_{delay}\right)^2. \quad (7)$$

From Equation (7), the value of $W_R$ can be obtained by using several parameters of the breaker and the transmission line. In comparison with the needed energy capability of conventional breakers as depicted in:

$$W_R = \frac{1}{2}L\frac{V_{clamp}}{V_{clamp} - V_{DC}}I_0^2. \quad (8)$$

the energy capability of the diode clamped SSCB can be lower in most cases because the value of $V_{c2}(0)$ is significantly smaller than $V_{DC}$ and the value of $$\frac{V_{c2}(0)}{L}t_{delay}$$

is usually negligible compared to $I_0$. In short, the MOVs that have a rated voltage and clamping voltage higher than $V_{C2}$ as well as energy absorbing capability higher than $W_R$ can be selected as the surge protectors for this topology.

Power Semiconductor Devices Selection.

To implement the diode clamped SSCB as shown in FIG. 3, several power semiconductor devices including four active switching devices and two diodes are needed. Their selection can be based on parameters including voltage rating, current rating and conducting efficiency. From the voltage rating point of view, the switching devices $S_2$ and $S_3$ should be able to sustain the voltage value across capacitor $C_{DC}1$; switching devices $S_1$ and $S_4$ should be capable of holding the clamping voltage of the MOV; and diodes $D_1$ and $D_2$ need to bear the voltage of $C_{DC}1$ during normal operation. In terms of current rating, all the semiconductor devices should to be higher than $I_0+(V_{c2}(0)/L)t_{delay}$. In regard to conducting efficiency, IGBTs, GaN HEMTs, SiC MOSFETs and SiC JFETs with low $R_{ds(on)}$ or $V_{ds(on)}$ are superior candidates as applied to solid-state circuit breakers at different voltage levels.

Experimental Results

Figure 8:
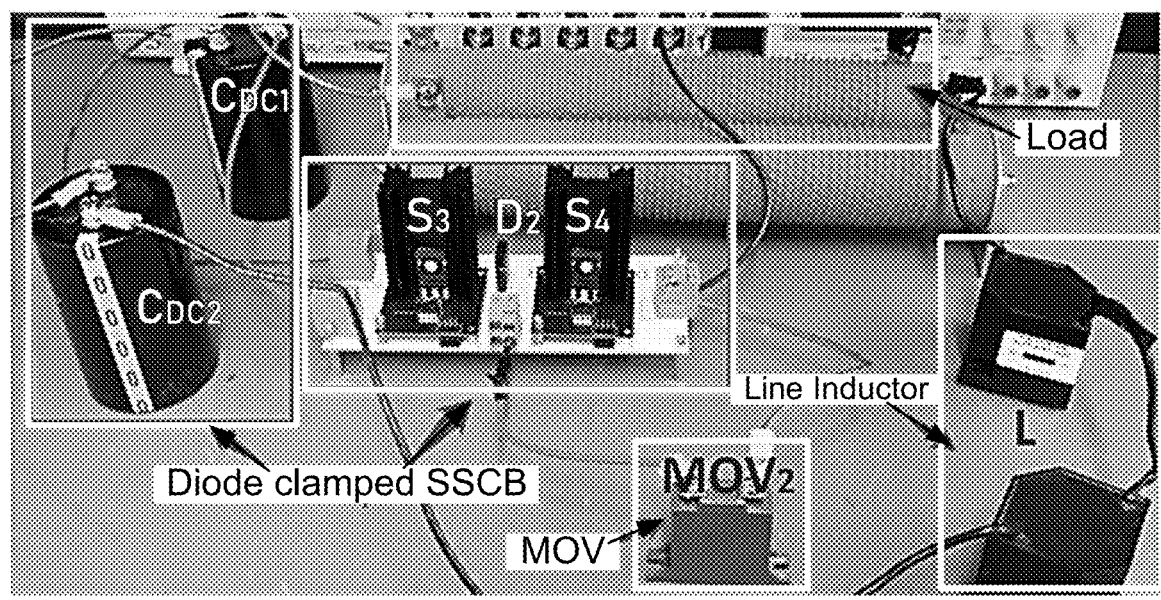
FIG. 8 is an image showing a fabricated diode clamped SSCB topology, in accordance with various embodiments of the present disclosure.

To validate the feasibility of the disclosed diode clamped SSCB, an image of an experimental setup of the breaker was fabricated as shown in FIG. 8. The components of the diode clamped SSCB according to FIG. 3 are labeled in the image. In the setup of FIG. 8, the fabricated diode clamped SSCB comprises Infineon's SiC MOSFETs (IMW120R045M), GeneSiC's SiC Schottky Diodes (GC20MPS12), TDK's MOVs (B72240B0750K) and two capacitors for voltage clamping.

In the experiment, the fabricated diode clamped SSCB was applied to a testing system with a 200V DC source and an 800 W pure resistive load. The transmission line between the source and load was modeled by a 1 mH inductor. The current interruption experiments of the breaker with both symmetric and asymmetric configurations were evaluated while operating in the testing system and the experimental results are presented next.

Diode Clamped SSCB with Symmetric Configuration.

Figure 9:
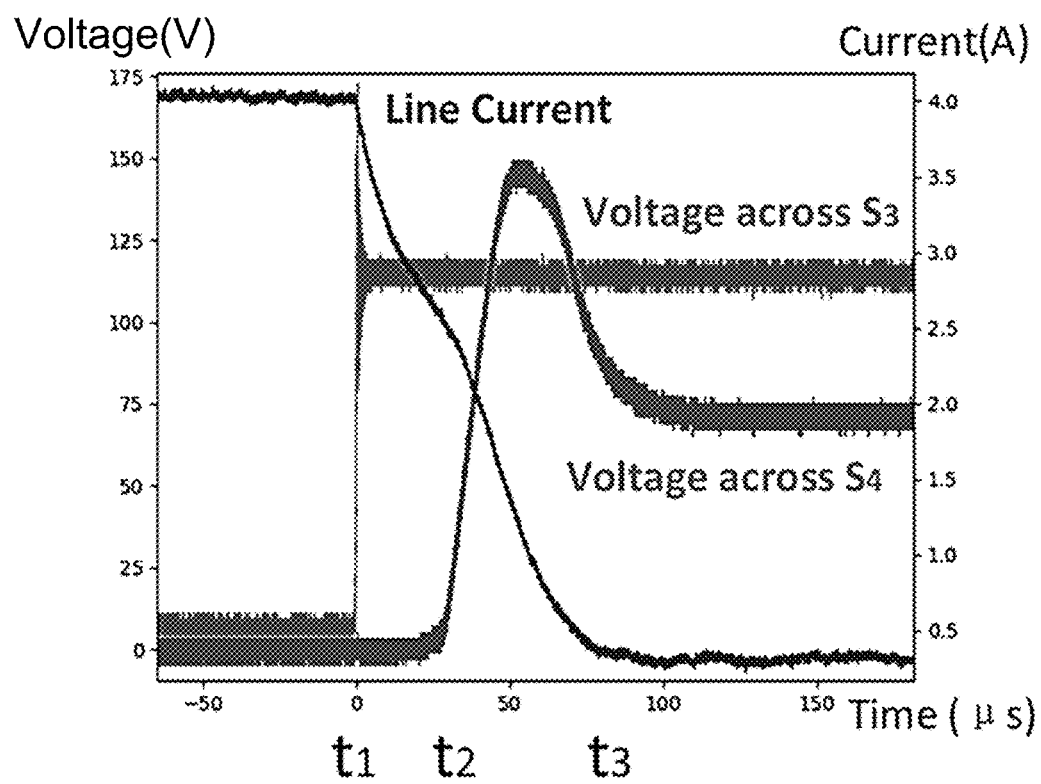
FIGS. 9, 10 and 11 illustrate examples of experimental line current and switch voltages in the diode clamped SSCB topology of FIG. 8 with symmetrical and asymmetrical configurations, in accordance with various embodiments of the present disclosure.

Two 1 mF capacitors were used to configure the diode clamped SSCB with symmetric configuration. Examples of line current waveform and the voltages across the line-side switches during the breaking process of the diode clamped SSCB are shown in FIG. 9. As seen in the plots of FIG. 9, before $t_1$ the line current equals the rated load current and the voltage across the two switches equals their forward conducting voltage since both switches are turned on. During the interval from $t_1$ to $t_2$, line current decreases because switch $S_3$ is open causing the voltage across the transmission line and load to decrease to $V_{c2}$. After that, switch $S_4$ opens and the voltage across $S_4$ increases abruptly until it is clamped by the MOV. At last, the MOV absorbs the energy stored in the transmission line inductor and line current decreases gradually until it reaches zero at $t_3$.

As seen from the experimental results, there is no dynamic overvoltage across the switches during the interruption process even though the two switches are tripped sequentially with a time difference of 2.5×10−5 second. Therefore, the experimental results validate that the diode clamped SSCB does not have a dynamic voltage unbalancing issue in its current breaking process.

Diode Clamped SSCB with Asymmetric Configuration.

Figure 10:
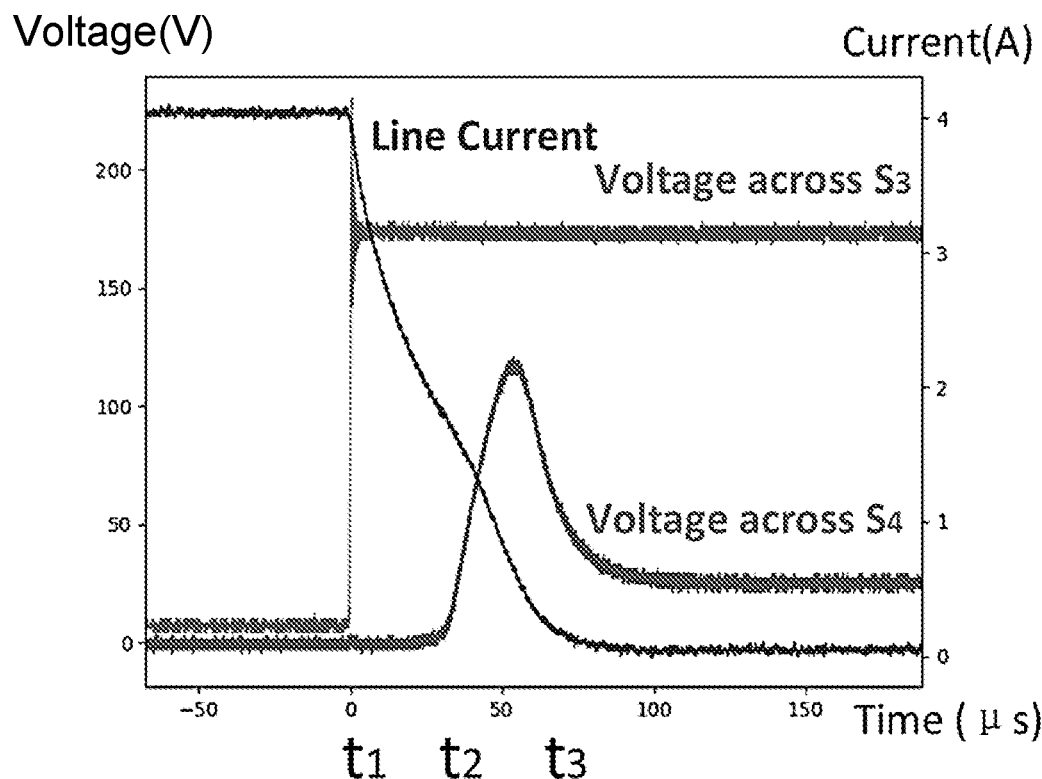

Here, the diode clamped SSCB included two capacitors with values of 1 mF and 0.22 mF. FIG. 10 shows an example of the experimental results of line current and switch voltages in the breaker with asymmetric configuration during its operation. From the waveform in FIG. 10, it can be seen that the asymmetric configuration also does not incur dynamic voltage unbalancing issue through its current interruption process.

Figure 11:
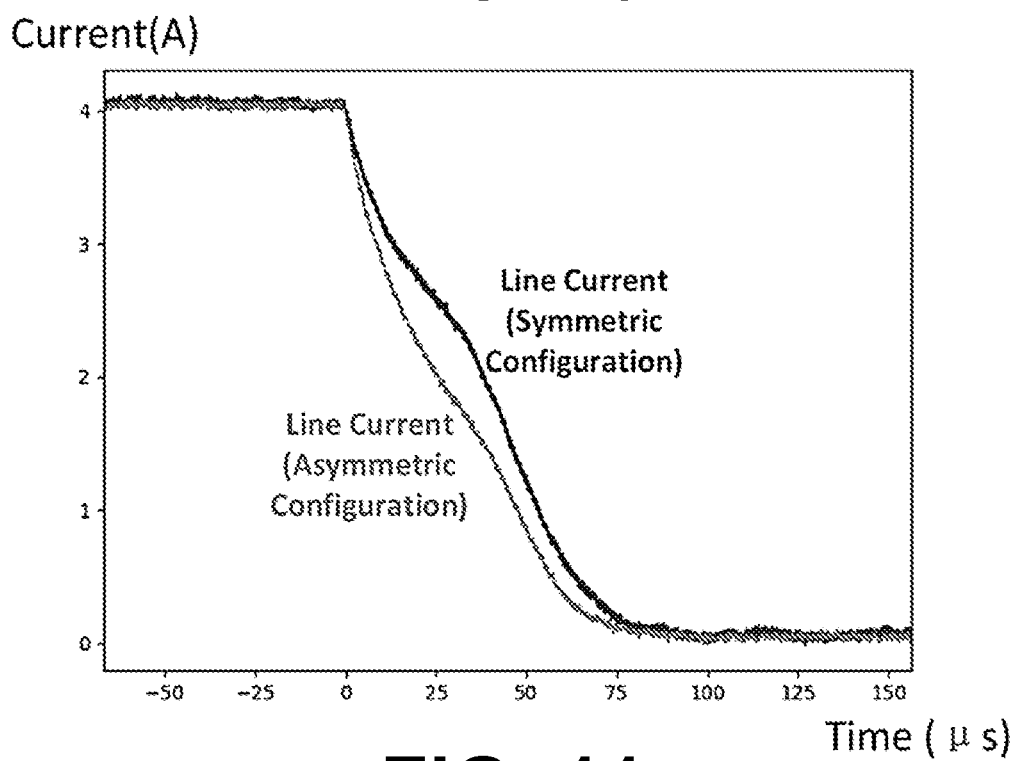

Moreover, the current breaking time in the diode clamped SSCB is shorter with asymmetric configuration. FIG. 11 shows a comparison of the experimental results of line currents in diode clamped SSCBs with symmetric and asymmetric configurations applied to the same testing system. As shown in FIG. 11, the line current breaks faster with the asymmetric configuration. This validates its advantage in breaking speed.

Figure 12:
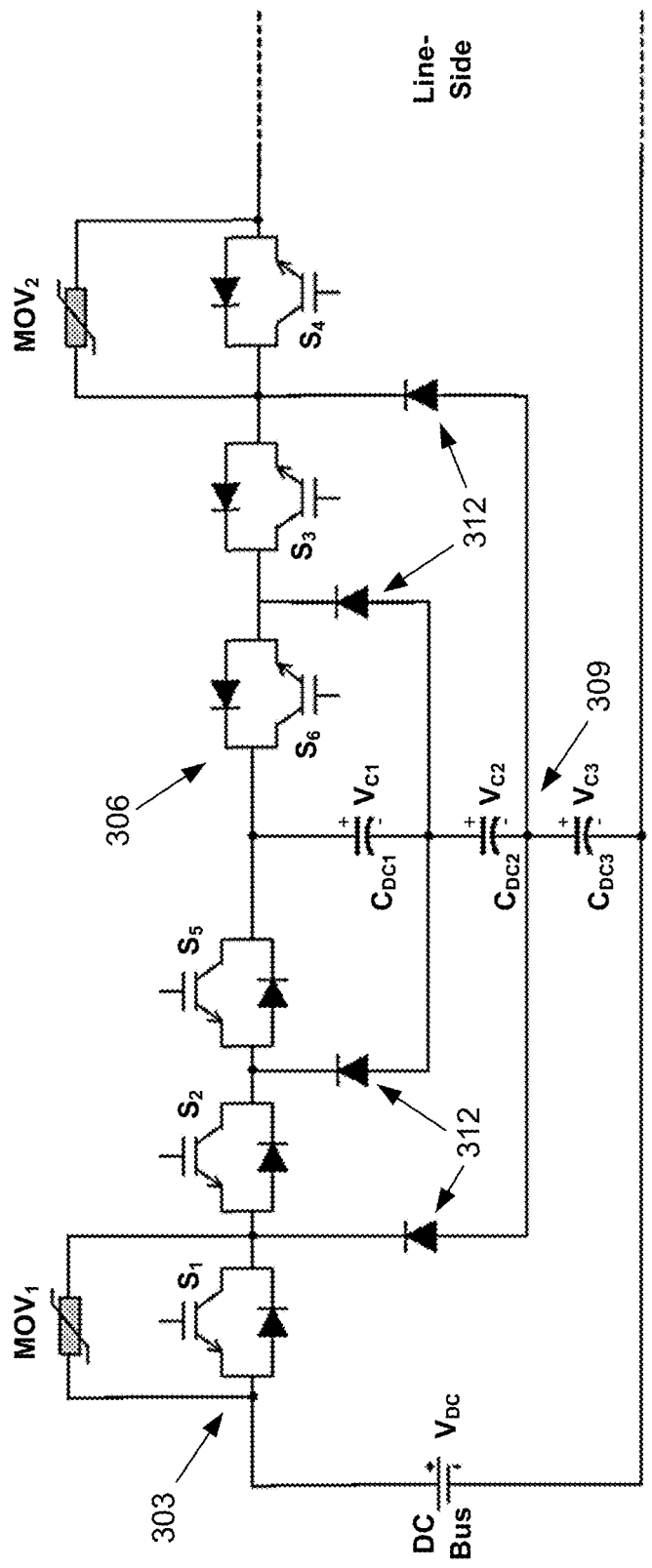
FIG. 12 is a schematic diagram illustrating an extension of the diode clamped SSCB topology to three levels, in accordance with various embodiments of the present disclosure.

The diode clamped SSCB topology is not limited to two levels; and in principal it can be extended to as many levels as needed, with a limiting factor being the availability of clamping diodes with the needed reverse voltage blocking capability. This allows the diode clamped SSCB architecture to work for even higher voltage levels using the same lower voltage devices. FIG. 12 is a schematic diagram illustrating an extension of the diode clamped SSCB topology to a three-level design, where the voltage rating of the SSCB is three times the rating of the semiconductor switches. Additional devices can be incorporated to further extend the topology as can be understood.

This disclosure has presented a new diode clamped SSCB topology. Unlike a conventional SSCB using series connected semiconductor devices for medium level voltage breaking, which incurs dynamic voltage unbalancing issues, the diode clamped SSCB utilizes a diode clamped structure to protect the system while employing low voltage rated power semiconductor devices. The diode clamped SSCB topology does not experience dynamic voltage unbalancing during its breaking operation. Symmetric and asymmetric configurations are presented. The asymmetric configuration can shorten the current breaking time and reduce the energy absorption of the diode clamped SSCB. The feasibility and superiority of the diode clamped SSCBs with both symmetric and asymmetric configurations have been shown through simulations, algebraic analyses and experimental results. The attributes of the diode clamped SSCB make it a competitive alternative to conventional solid-state circuit breakers in medium voltage protection systems.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

The terminology used herein is for the purpose of describing particular embodiments only and is not intended to be limiting of the invention. As used herein, the term "and/or" includes any and all combinations of one or more of the associated listed items. As used herein, the singular forms "a," "an," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one having ordinary skills in the art to which this invention belongs. It will be further understood that the terms, such as those defined in commonly used dictionaries, should be interpreted as having a meaning that is consistent with their meaning in the context of the relevant art and the present disclosure and will not be interpreted in an idealized or overly formal sense unless they are expressly so defined herein.

The term "substantially" is meant to permit deviations from the descriptive term that do not negatively impact the intended purpose. Descriptive terms are implicitly understood to be modified by the word substantially, even if the term is not explicitly modified by the word substantially.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate it, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A diode clamped solid-state circuit breaker (SSCB), comprising:
    a series of N source-side switches connected in series between a first DC source connection and a common connection point, the series of N source-side switches comprising a first source-side switch connected to the first DC source connection and a second source-side switch connected adjacent to the first source-side switch;
    a series of N line-side switches connected in series between a line-side connection and the common connection point, the series of N line-side switches comprising a first line-side switch connected to the line-side connection and a second line-side switch connected adjacent to the first line-side switch;
    a series of N clamping capacitors connected in series between a second DC source connection and the common connection point, the series of N clamping capacitors comprising a first clamping capacitor connected to the second DC source connection and a second clamping capacitor connected adjacent to the first clamping capacitor;
    a source-side surge protector connected across the first source-side switch;
    a line-side surge protector connected across the first line-side switch;
    a source-side clamping diode connected at a first end between the first and second source-side switches and at a second end between the first and second clamping capacitors; and
    a line-side clamping diode connected at a first end between the first and second line-side switches and at a second end between the first and second clamping capacitors.

2. The SSCB of claim 1, comprising control circuitry configured to control switching of the series of N source-side switches in response to a detected source-side fault and the series of N line-side switches in response to a detected line-side fault.

3. The SSCB of claim 2, wherein the control circuitry comprises gate drivers associated with the series of N source-side switches and the series of N line-side switches.

4. The SSCB of claim 2, wherein the control circuitry sequentially turns off the series of N source-side switches from an N-th source-side switch to the first source-side switch in response to the detected source-side fault.

5. The SSCB of claim 4, wherein the control circuitry turns off the second source-side switch before turning off the first source-side switch.

6. The SSCB of claim 2, wherein the control circuitry sequentially turns off the series of N line-side switches from an N-th line-side switch to the first line-side switch in response to the detected line-side fault.

7. The SSCB of claim 6, wherein the control circuitry turns off the second line-side switch before turning off the first line-side switch.

8. The SSCB of claim 2, wherein N is greater than two.

9. The SSCB of claim 1, comprising a second source-side clamping diode connected at a first end between the second source-side switch and a third source-side switch connected adjacent to the second source-side switch, and at a second end between the second clamping capacitor and a third clamping capacitor of the series of N clamping capacitors, the third clamping capacitor connected adjacent to the second clamping capacitor; and a second line-side clamping diode connected at a first end between the second line-side switch and a third line-side switch connected adjacent to the second line-side switch, and at a second end between the second clamping capacitor and the third clamping capacitor.

10. The SSCB of claim 9, comprising control circuitry configured to sequentially turn off the series of N source-side switches in response to the detected source-side fault, wherein the control circuitry turns off the third source-side switch before turning off the second source-side switch, and turns off the second source-side switch before turning off the first source-side switch.

11. The SSCB of claim 9, comprising control circuitry configured to sequentially turn off the series of N line-side switches in response to the detected line-side fault, wherein the control circuitry turns off the third line-side switch before turning off the second line-side switch, and turns off the second line-side switch before turning off the first line-side switch.

12. The SSCB of claim 1, wherein the first and second clamping capacitors have equal capacitance.

13. The SSCB of claim 1, wherein the first and second clamping capacitors have different capacitances.

14. The SSCB of claim 13, wherein the capacitance of the first clamping capacitor is greater than the capacitance of the second clamping capacitor.

15. A method, comprising:

supplying DC voltage through a diode clamped solid-state circuit breaker (SSCB) by turning on a series of N source-side switches and a series of N line-side switches of the SSCB, the series of N source-side switches connected in series between a first DC source connection and a common connection point and the series of N line-side switches connected in series between a line-side connection and the common connection point, the series of N source-side switches comprising a first source-side switch connected to the first DC source connection and a second source-side switch connected adjacent to the first source-side switch and the series of N line-side switches comprising a first line-side switch connected to the line-side connection and a second line-side switch connected adjacent to the first line-side switch, the SSCB further comprising a series of N clamping capacitors connected in series between a second DC source connection and the common connection point, N−1 source-side clamping diodes each connected between different pairs of adjacent source-side switches in the series of N source-side switches and different pairs of adjacent clamping capacitors in the series of N clamping capacitors, and N−1 line-side clamping diodes each connected between different pairs of adjacent line-side switches in the series of N line-side switches and the different pairs of adjacent clamping capacitors;

detecting a source-side fault or a line-side fault; and sequentially turning off the series of N source-side switches from an N-th source-side switch to the first source-side switch in response to the detected source-side fault, where the second source-side switch is turned off before the first source-side switch is turned off to direct current flow through a first clamping capacitor of the series of N clamping capacitors and one of the N−1 source-side clamping diodes and the first source-side switch is turned off to direct current flow through a surge protector connected across the first source-side switch; or sequentially turning off the series of N line-side switches from an N-th line-side switch to the first line-side switch in response to the detected line-side fault, where the second line-side switch is turned off before the first line-side switch is turned off to direct current flow through the first clamping capacitor and one of the N−1 line side clamping diodes and the first line-side switch is turned off to direct current flow through a surge protector connected across the first line-side switch.

16. The method of claim 15, wherein N equals two and the series of N clamping capacitors comprises the first clamping capacitor and a second clamping capacitor, wherein the first and second clamping capacitors have equal capacitance.

17. The method of claim 15, wherein N equals two and the series of N clamping capacitors comprises the first clamping capacitor and a second clamping capacitor, wherein a capacitance of the first clamping capacitor is greater than a capacitance of the second clamping capacitor.

18. The method of claim 15, wherein sequentially turning off the series of N source-side switches comprises turning off a third source-side switch before the second source-side switch is turned off to direct current flow through the first clamping capacitor and a second clamping capacitor and another one of the N−1 source-side clamping diodes.

19. The method of claim 15, wherein sequentially turning off the series of N line-side switches comprises turning off a third line-side switch before the second line-side switch is turned off to direct current flow through the first clamping capacitor and a second clamping capacitor and another one of the N−1 line-side clamping diodes.

20. The method of claim 15, wherein each clamping capacitor of the series of N clamping capacitors has a different capacitance.

* * * * *